(12) United States Patent
Choi et al.

(10) Patent No.: US 10,165,715 B2
(45) Date of Patent: Dec. 25, 2018

(54) APPARATUS AND METHOD OF MANUFACTURING DISPLAY DEVICE USING A ROTATING BENDING UNIT

(71) Applicant: Samsung Display Co., Ltd., Yongin-si, Gyeonggi-do (KR)

(72) Inventors: Myunggil Choi, Yongin-si (KR); Jungmin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/448,455

(22) Filed: Mar. 2, 2017

(65) Prior Publication Data
US 2017/0257988 A1  Sep. 7, 2017

(30) Foreign Application Priority Data
Mar. 4, 2016 (KR) .......................... 10-2016-0026675

(51) Int. Cl.
| G02F 1/13 | (2006.01) |
| G02F 1/1333 | (2006.01) |
| H05K 13/00 | (2006.01) |
| B29C 53/04 | (2006.01) |
| B29L 31/34 | (2006.01) |

(52) U.S. Cl.
CPC .............. *H05K 13/00* (2013.01); *B29C 53/04* (2013.01); *H05K 13/0023* (2013.01); *B29L 2031/3475* (2013.01)

(58) Field of Classification Search
CPC ..... H01L 51/56; B32B 37/0053; B32B 37/12; B32B 2457/20; B29C 63/0073; B29C 63/0047; B29C 2043/3644; B29C 2043/3647
See application file for complete search history.

(56) References Cited

U.S. PATENT DOCUMENTS

| 8,857,490 B2* | 10/2014 | Sung ..................... B32B 37/003 156/538 |
| 2003/0145943 A1* | 8/2003 | Lee ...................... B32B 37/0046 156/285 |
| 2004/0231778 A1* | 11/2004 | Teschner ........... B32B 17/10018 156/102 |
| 2016/0001536 A1* | 1/2016 | Ok ........................ B32B 37/003 156/256 |
| 2016/0081180 A1* | 3/2016 | Huitema ............. H01L 51/0097 361/749 |

FOREIGN PATENT DOCUMENTS

KR  10-2015-0114407  10/2015 (A)

OTHER PUBLICATIONS

Lee et al. Korean Patent Application 2015-0114407, Oct. 2015, Machine Translation.*

* cited by examiner

*Primary Examiner* — Tracie Y Green
(74) *Attorney, Agent, or Firm* — Lewis Roca Rothgerber Christie LLP

(57) ABSTRACT

An apparatus and a method of manufacturing a display device are disclosed. In one aspect, the apparatus includes a stage on which at least a portion of a component of the display device is seated and a bending unit provided on the stage. The bending unit is configured to bend the component of the display device and attach a portion of the component of the display device to another portion of the component of the display device.

18 Claims, 8 Drawing Sheets

APPARATUS AND METHOD OF MANUFACTURING DISPLAY DEVICE USING A ROTATING BENDING UNIT

CROSS-REFERENCE TO RELATED PATENT APPLICATION

This application claims priority to and the benefit of Korean Patent Application No. 10-2016-0026675, filed on Mar. 4, 2016, in the Korean Intellectual Property Office, the disclosure of which is incorporated herein in its entirety by reference.

BACKGROUND

Field

The described technology generally relates to an apparatus and a method of manufacturing a display device.

Description of the Related Technology

Electronic devices based on mobility have come into widespread use. Recently, tablet computers, in addition to small electronic devices such as mobile phones, are in wide use.

In order to support various functions, the mobile devices include a display device for providing a user with visual information such as images or videos. As components for driving such display devices have become miniaturized, density of the displays in electronic devices gradually increases. Moreover, a structure that may be curved to have a predetermined angle from a flat state has been developed.

SUMMARY OF CERTAIN INVENTIVE ASPECTS

One inventive aspect relates to an apparatus and method of manufacturing a display device, by which a stress applied to a member when the member is bent is minimized.

Another aspect is an apparatus for manufacturing a display device that includes a stage on which at least a portion of a member is seated; and a bending unit provided on the stage to attach to the member and bend the member and to attach a portion of the member to another portion of the member, wherein the bending unit includes a support; a first linear movement unit provided on the support to linearly move in a first direction; a first rotating unit connected to the first linear movement unit to attach to the member and to bend the member; and a second linear movement unit on which the support is provided and which linearly moves the support in a second direction different from the first direction.

The first linear movement unit may include a first moving block provided on the support to linearly move; and a first linear driving unit provided on the support to linearly move the first moving block.

The first linear movement unit may further include a first guide unit provided between the first moving block and the support.

The first linear movement unit may further include a first connection bracket configured to connect the first moving block to the first rotating unit.

The first rotating unit may include a first rotation driving unit connected to the first linear movement unit; and a first attachment unit rotatably connected to the first rotation driving unit to attach a second surface of the member thereto.

The first rotating unit may further include a first decelerator configured to connect the first rotation driving unit to the first attachment unit.

The apparatus may further include a second rotating unit configured to connect the first linear movement unit to the first rotating unit and rotate the first rotating unit.

The second rotating unit may include a second rotation driving unit provided on the first linear movement unit; and a second rotating bracket provided so that the first rotating unit is fixed to the second rotating bracket, the second rotating bracket rotating as the second rotation driving unit is driven.

The second rotating unit may further include a second decelerator configured to connect the second rotation driving unit to the second rotating bracket.

The second linear movement unit may include a second moving block on which the support is provided and which linearly moves; and a second linear driving unit connected to the second moving block to linearly move the second moving block.

The second linear movement unit may further include a second guide unit on which the second moving block is provided.

The second linear movement unit may further include a second connection bracket configured to connect the second moving block to the support.

The bending unit may further include a third linear movement unit configured to connect the second linear movement unit to the support and to linearly move the support in a third direction different from the first and second directions.

The third linear movement unit may further include a third moving block on which the support is provided; and a third linear driving unit connected to the third moving block to linearly move the third moving block.

The third linear movement unit may further include a third guide unit configured to connect the third moving block to the second linear movement unit and guide motion of the third moving block.

The apparatus may further include a stage driving unit connected to the stage to linearly move the stage.

The apparatus may further include an alignment unit provided on the stage to move the stage according to locations of the member.

The apparatus may further include a first location detecting unit disposed on a moving path of the stage to sense a location of the member on the stage.

The apparatus may further include a second location detecting unit disposed apart from the bending unit to sense a location of the member on a lower surface of the bending unit.

The apparatus may further include a pressurizer provided on the first rotating unit to press a portion of the bent member against another portion of the member.

The member may include a first surface and a second surface different from the first surface, and the bending unit may attach a portion of the second surface thereto and bend the member to attach a portion of the first surface to another portion of the first surface.

Another aspect is a method of manufacturing a display device includes seating at least a portion of a member on a stage; arranging the member on a lower surface of a bending unit; and attaching the bending unit to the member and bending the member along a bending path of the member.

The method may further include comparing an actual location of the member with a preset location for the member.

The method may further include positioning the member based on the comparing of the actual location of the member with the preset location for the member.

The method may further include attaching a portion of the member to an adhesion member by applying pressure to the member.

The adhesion member may be smaller than the member.

The member may be flexible.

The method may further include sensing a location of the member on the stage.

The method may further include varying a location of the stage, based on the location of the member.

The member may include at least one of a display panel and a flexible printed circuit board (PCB).

At least one of the display panel and the flexible PCB may be bent when the member is bent.

The member may include an attachment region to which the bending unit is attached.

The member may include a first surface and a second surface different from the first surface, and the bending unit may attach a portion of the second surface thereto and bend the member to attach a portion of the first surface to another portion of the first surface.

Another aspect is an apparatus for manufacturing a display device, the apparatus comprising: a stage on which at least a portion of a component of the display device is seated; and a bending unit provided on the stage and configured to i) bend the component of the display device and ii) attach a portion of the component of the display device to another portion of the component of the display device. The bending unit comprises: a support; a first linear movement unit provided on the support and configured to linearly move in a first direction; a first rotating unit connected to the first linear movement unit and configured to bend the component of the display device; and a second linear movement unit on which the support is provided and configured to linearly move the support in a second direction different from the first direction.

In the above apparatus, the first linear movement unit comprises: a first moving block provided on the support and configured to linearly move; and a first linear driving unit provided on the support and configured to linearly move the first moving block.

In the above apparatus, the first linear movement unit further comprises a first guide unit provided between the first moving block and the support.

In the above apparatus, the first linear movement unit further comprises a first connection bracket configured to connect the first moving block to the first rotating unit.

In the above apparatus, the first rotating unit comprises: a first rotation driving unit connected to the first linear movement unit; and a first attachment unit rotatably connected to the first rotation driving unit and configured to attach a second surface of the component of the display device thereto.

In the above apparatus, the first rotating unit further comprises a first decelerator configured to connect the first rotation driving unit to the first attachment unit.

The above apparatus further comprises a second rotating unit configured to connect the first linear movement unit to the first rotating unit and rotate the first rotating unit.

In the above apparatus, the first rotating unit comprises a first attachment unit configured to attach a second surface of the component of the display device thereto, and wherein the second rotating unit comprises: a second rotation driving unit provided on the first linear movement unit and configured to rotate the first attachment unit; and a second rotating bracket provided so that the first rotating unit is fixed to the second rotating bracket, the second rotating bracket configured to rotate when the second rotation driving unit rotates the first attachment unit.

In the above apparatus, the second rotating unit further comprises a second decelerator configured to connect the second rotation driving unit to the second rotating bracket.

In the above apparatus, the second linear movement unit comprises: a second moving block on which the support is provided and configured to linearly move; and a second linear driving unit connected to the second moving block and configured to linearly move the second moving block.

In the above apparatus, the second linear movement unit further comprises a second guide unit on which the second moving block is provided.

In the above apparatus, the second linear movement unit further comprises a second connection bracket configured to connect the second moving block to the support.

In the above apparatus, the bending unit further comprises a third linear movement unit configured to connect the second linear movement unit to the support and linearly move the support in a third direction different from the first and second directions.

In the above apparatus, the third linear movement unit further comprises: a third moving block on which the support is provided; and a third linear driving unit connected to the third moving block and configured to linearly move the third moving block.

In the above apparatus, the third linear movement unit further comprises a third guide unit configured to connect the third moving block to the second linear movement unit and guide the third moving block.

The apparatus further comprises a stage driving unit connected to the stage and configured to linearly move the stage.

The apparatus further comprises an alignment unit provided on the stage and configured to move the stage according to a location of the component of the display device.

The apparatus further comprises a first location detecting unit disposed on a moving path of the stage and configured to sense a location of the component of the display device on the stage.

The apparatus further comprises a second location detecting unit disposed apart from the bending unit and configured to sense a location of the component of the display device on a surface of the bending unit.

The apparatus further comprises a pressurizer provided on the first rotating unit and configured to press a portion of the bent component of the display device against another portion of the component of the display device.

In the above apparatus, the component of the display device comprises a first surface and a second surface different from the first surface, and wherein the bending unit is configured to attach a portion of the second surface thereto and bend the component of the display device so as to attach a portion of the first surface to another portion of the first surface.

Another aspect is a method of manufacturing a display device, the method comprising: placing at least a portion of a component of the display device on a stage; arranging the component of the display device on a surface of a bending unit; and attaching the bending unit to the component of the display device and bending the component of the display device along a bending path of the component of the display device.

The above method further comprises comparing an actual location of the component of the display device with a preset location for the component of the display device.

The above method further comprises positioning the component of the display device based on the comparing of the actual location of the component of the display device with the preset location for the component of the display device.

The above method further comprises applying pressure to the component of the display device so as to attach a portion of the component of the display device to an adhesion member.

In the above method, the adhesion member is smaller than the component of the display device.

In the above method, the component of the display device is flexible.

The above method further comprises sensing a location of the component of the display device on the stage.

The above method further comprises varying a location of the stage based on the location of the component of the display device.

In the above method, the component of the display device comprises at least one of a display panel and a flexible printed circuit board (PCB).

In the above method, at least one of the display panel and the flexible PCB is bent when the component of the display device is bent.

In the above method, the component of the display device comprises an attachment region to which the bending unit is attached.

In the above method, the component of the display device comprises a first surface and a second surface different from the first surface, wherein the bending unit is configured to attach a portion of the second surface thereto and bend the component of the display device so as to attach a portion of the first surface to another portion of the first surface.

In the above method, applying force to a portion of the component of the display device when the component of the display device is bent so as to prevent warping of the component of the display device.

Another aspect is an apparatus for manufacturing a display device, the apparatus comprising: a stage on which at least a portion of a component of the display device is seated; and a bending unit provided on the stage and configured to attach a portion of the component of the display device to another portion of the component so as to bend the component.

Warping of the member may be prevented by applying force to a portion of the member when the member is bent.

DETAILED DESCRIPTION OF CERTAIN INVENTIVE EMBODIMENTS

Figure 1:
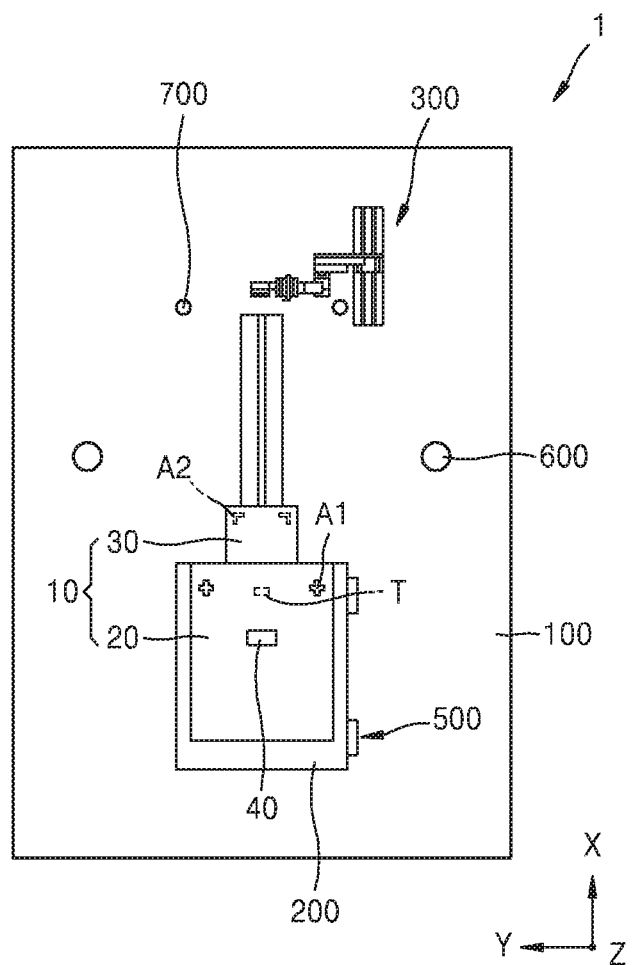
FIG. 1 is a plan view of an apparatus for manufacturing a display device, according to an embodiment.

In general, when a flexible member is bent, a condensing force and a tensile force that are generated when the flexible member is bent and then twisted are applied to the flexible member, and thus the flexible member may be damaged. In this case, the quality of display devices degrades.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of" when preceding a list of elements, modify the entire list of elements and do not modify the individual elements of the list.

As the described technology allows for various changes and numerous embodiments, particular embodiments will be illustrated in the drawings and described in detail in the written description. Hereinafter, effects and features of the described technology and a method for accomplishing them will be described more fully with reference to the accompanying drawings, in which exemplary embodiments are shown. The described technology may, however, be embodied in many different forms and should not be construed as limited to the exemplary embodiments set forth herein.

One or more embodiments will be described below in more detail with reference to the accompanying drawings. Those components that are the same or are in correspondence are rendered same reference numeral regardless of the figure number, and redundant explanations are omitted.

It will be understood that although the terms "the first", "the second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
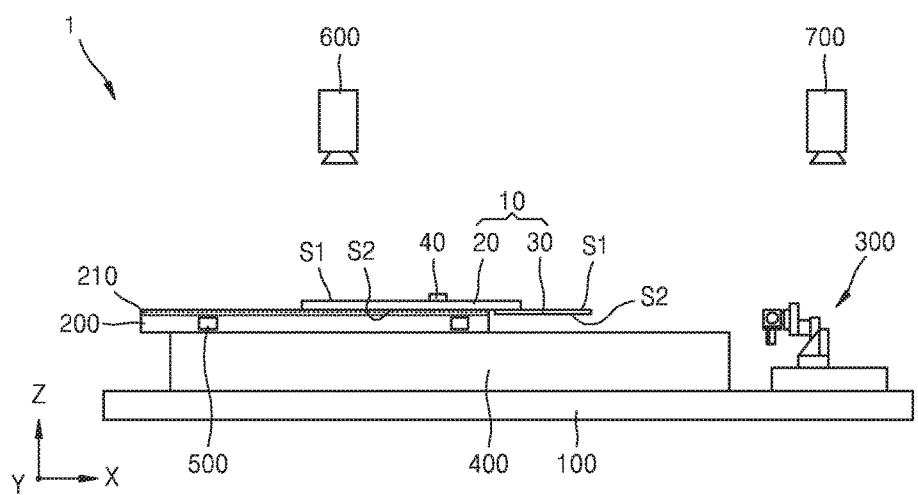
FIG. 2 is a front view of the apparatus of FIG. 1.
Figure 3:
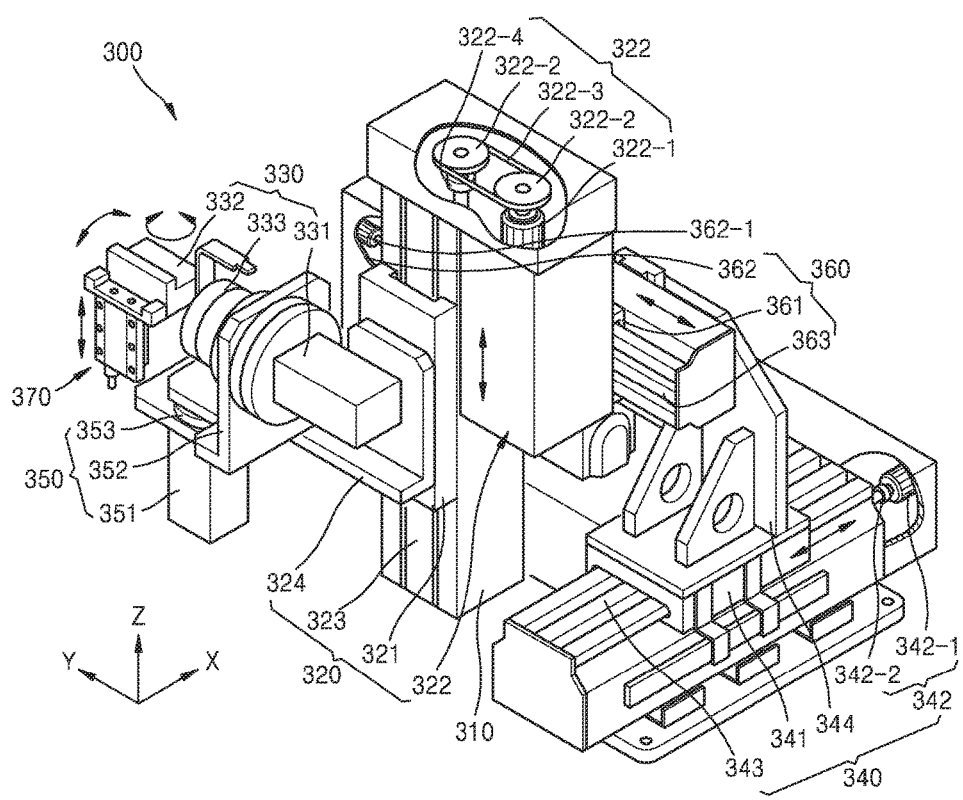
FIG. 3 is a perspective view of an embodiment of a bending unit illustrated in FIG. 1.
Figure 4:
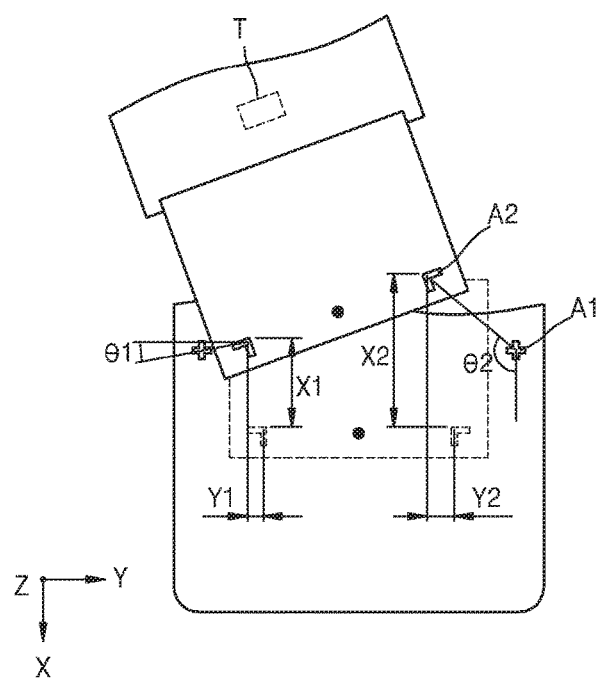
FIG. 4 is a graph showing an image of a member photographed by a second location detecting unit included in the apparatus of FIG. 1.
Figure 5:
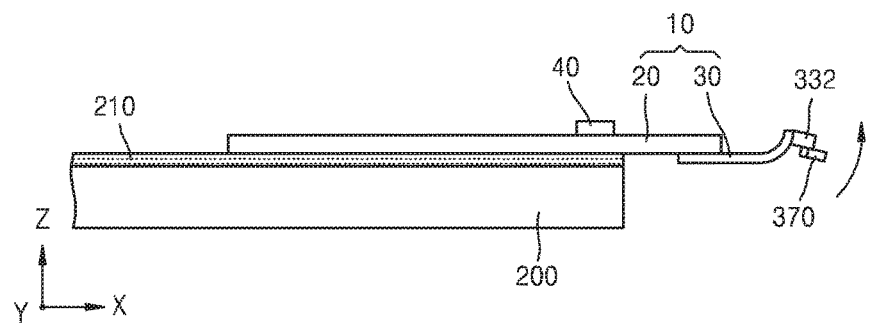
FIGS. 5-7 are cross-sectional views for explaining a method of manufacturing a display device by using the apparatus of FIG. 1.
Figure 6:
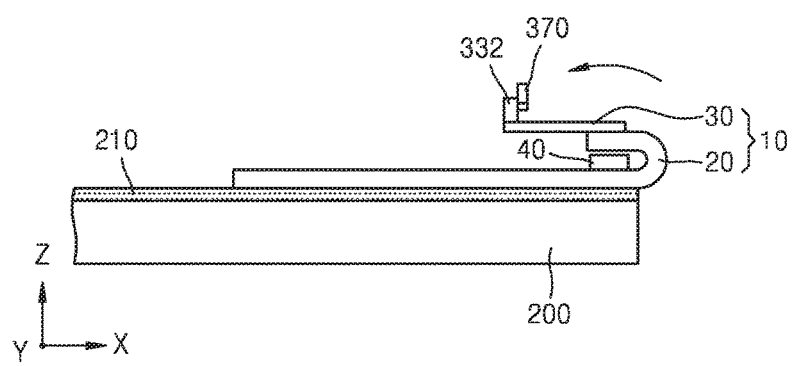
Figure 7:
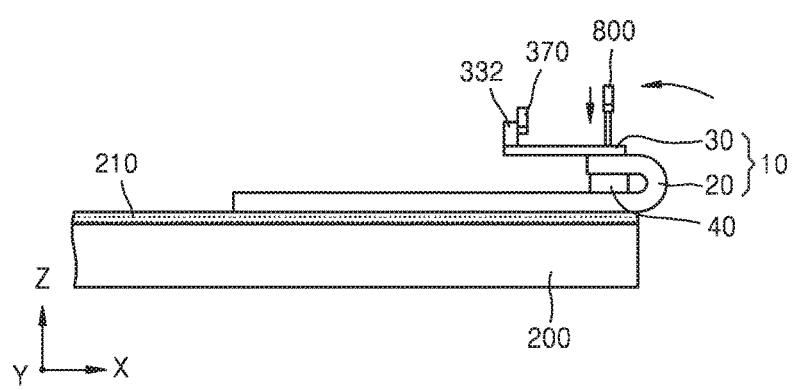

FIG. 1 is a plan view of an apparatus 1 for manufacturing a display device, according to an embodiment. FIG. 2 is a front view of the apparatus 1 of FIG. 1. FIG. 3 is a perspective view of an embodiment of a bending unit 300 illustrated in FIG. 1. FIG. 4 is a graph showing an image of a member photographed by a second location detecting unit included in the apparatus of FIG. 1. FIGS. 5-7 are views for explaining a method of manufacturing a display device by using the apparatus 1 of FIG. 1.

Referring to FIGS. 1-7, the apparatus 1 includes a housing 100, a stage 200, a bending unit 300, a stage driving unit 400, an alignment unit 500, a first location detecting unit 600, and a second location detecting unit 700.

The housing 100 may be fixed. The housing 100 may include a plurality of frames, a plurality of plates, and the like. According to another embodiment, the housing 100 is formed in a chamber shape.

A member 10 may be safely seated on the stage 200. The member 10 may include at least one of a display panel 20 and a flexible printed circuit board (PCB) 30. For convenience of description, a case where the member 10 includes the display panel 20 and the flexible PCB 30 will now be described in detail.

The member 10 may have a first surface S1 and a second surface S2. The second surface S2 may be a surface facing the stage 200, and the first surface S1 may be a surface different from the second surface S2. A portion of the second surface S2 may be safely seated on the stage 200, and a portion of the second surface S2 may be spaced apart from the stage 200. For example, a second surface S2 of the display panel 20 is safely seated on the stage 200, and a second surface S2 of the flexible PCB 30 is spaced apart from the stage 200. The member 10 may be flexible.

A display region (not shown) may be disposed on one of the first and second surfaces S1 and S2 of the display panel 20. The other surface may be a rear surface of the display panel 20 on which the display region is not formed. For convenience of description, a case where the display region is formed on the second surface S2 of the display panel 20 will now be described in detail.

The stage 200 may be formed in a plate shape. A member fixer 210 for safely seating the member 10 thereon and then fixing the member 10 thereto may be disposed on the stage 200. The member fixer 210 may be formed in various shapes. For example, the member fixer 210 may include an electrostatic chuck or an adhesive chuck provided on the stage 200. According to another embodiment, the member fixer 210 includes a clamp, a jig, or the like provided on the stage 200. According to another embodiment, the member fixer 210 includes a flow path and a pump connected to the flow path, wherein the flow path and the pump are formed on the stage 200. For convenience of description, a case where the member fixer 210 includes an adhesive chuck provided on the stage 200 will now be described in detail.

The stage 200 may be provided on the housing 100 so as to be able to linearly move. The stage 200 may linearly move in a second direction (X direction).

The bending unit 300 may be fixed to the housing 100. The bending unit 300 may attach to a portion of the member 10 and bend the member 10 so that the portion of the member 10 may adhere to another portion of the member 10. For example, the bending unit 300 may attach to a portion of the second surface S2 and bend the member 10 so that the portion of the first surface S1 may adhere to another portion of the first surface S1. For example, the bending unit 300 attaches a portion of the second surface S2 of the flexible PCB 30 thereto and then bend a portion of the display panel 20 and the flexible PCB 30.

The bending unit 300 may include a support 310, a first linear movement unit 320, a first rotating unit 330, a second linear movement unit 340, a second rotating unit 350, a third linear movement unit 360, and a pressurizer 370.

The support 310 may be disposed in the first direction (Z direction). The first direction (Z direction) may be a direction perpendicular to (or crossing) one surface of the housing 100. The support 310 may be formed in a frame shape.

The first linear movement unit 320 may be provided on the support 310 and linearly move in the first direction (Z direction). The first linear movement unit 320 may include a first moving block 321, a first linear driving unit 322, a first guide unit 323, and a first connection bracket 324.

The first moving block 321 may be provided on the support 310 so as to be able to linearly move. The first moving block 321 may be connected to the first guide unit 323 and may move along the first guide unit 323.

The first linear driving unit 322 may be connected to the first moving block 321 and linearly move the first moving block 321. The first linear driving unit 322 may be formed in various shapes. For example, the first linear driving unit 322 includes a ball screw and a motor connected to the ball screw. According to another embodiment, the first linear driving unit 322 is formed according to a shape of a linear motor and may constitute a linear motor together with the first moving block 321. In this case, the first guide unit 323 may not be provided. According to another embodiment, the first linear driving unit 322 includes a cylinder that is connected to the first moving block 321. According to another embodiment, the first linear driving unit 322 includes a first motor 322-1, first pulleys 322-2 connected to the first motor 322-1 and spaced apart from each other, a first belt 322-3 connecting the spaced first pulleys 322-2 to each other, and a first ball screw 322-4 connected to one of the two first pulleys 322-2 and also connected to the first moving block 321. The first linear driving unit 322 is not limited thereto, and the first linear driving unit 322 may include any of devices and structures that linearly move the first moving block 321. However, for convenience of explanation, a case where the first linear driving unit 322 includes the first motor 322-1, the first pulleys 322-2, the first belt 322-3, and the first ball screw 322-4 will now be described in detail.

The first guide unit 323 may be disposed between the support 310 and the first moving block 321 and may guide a movement of the first moving block 321. The first guide unit 323 may include a linear motion guide.

The first connection bracket 324 may be fixed to the first moving block 321. The first connection bracket 324 may linearly move together with the first moving block 321, according to a movement of the first moving block 321.

The first rotating unit 330 may be connected to the first linear movement unit 320 and attach the second surface S2 to the first rotating unit 330 and rotate the member 10. The first rotating unit 330 may be directly connected to the first connection bracket 324. According to another embodiment, the first rotating unit 330 is connected to the second rotating unit 350. However, for convenience of description, a case where the first rotating unit 330 is connected to the second rotating unit 350 will now be described in detail.

The first rotating unit 330 may include a first rotation driving unit 331, a first attachment unit 332, and a first decelerator 333.

The first rotation driving unit 331 may be connected to the first attachment unit 332 and rotate the first attachment unit 332. The first rotation driving unit 331 may be formed in various shapes. For example, the first rotation driving unit 331 includes a first rotation motor connected to the first attachment unit 332. According to another embodiment, the first rotation driving unit 331 includes a first rotating motor, and a gear unit connected to the first rotating motor and the first attachment unit 332. According to another embodiment, the first rotation driving unit 331 includes a rotary cylinder that is connected to the first attachment unit 332. According to another embodiment, the first rotation driving unit 331 includes a first rotating motor, a first rotating pulley connected to the first rotating motor, a first rotating belt connected to the first rotating pulley, and a second rotating pulley connected to the first rotating belt and the first attachment unit 332. However, for convenience of description, a case where the first rotation driving unit 331 includes a rotating motor will now be described in detail.

The first attachment unit 332 may be connected to the first rotation driving unit 331 to rotate when the first rotation driving unit 331 rotates. The second surface S2 may be attached to the first attachment unit 332.

The first attachment unit 332 may be directly connected to the first rotation driving unit 331 or connected to the first rotation driving unit 331 via the first decelerator 333. However, for convenience of description, a case where the first attachment unit 332 is connected to the first rotation driving unit 331 via the first decelerator 333 will now be described in detail.

The first attachment unit 332 may be formed in various shapes so that the second surface S2 of the member 10 may be attached to the first attachment unit 332. For example, the first attachment unit 332 includes an electrostatic chuck or an adhesive chuck. According to another embodiment, the first attachment unit 332 is a type that adsorbs the member 10 by adjusting the pressure of a flow path by using the flow path and a pump connected to the flow path. For convenience of description, a case where the first attachment unit 332 is of an adhesive chuck type will now be described in detail.

The first decelerator 333 may connect the first rotation driving unit 331 to the first attachment unit 332. In this case, the first decelerator 333 may reduce a torque of the first rotation driving unit 331 and deliver a reduced torque to the first attachment unit 332.

The support 310 may be provided on the second linear movement unit 340. The second linear movement unit 340 may linearly move the support 310 in a second direction (X direction) different from the first direction (Z direction). The first direction (Z direction) and the second direction (X direction) may intersect with each other.

The second linear movement unit 340 may include a second moving block 341, a second linear driving unit 342, a second guide unit 343, and a second connection bracket 344.

The second moving block 341 may be disposed to linearly move along one surface of the housing 100. The second linear driving unit 342 may be connected to the second moving block 341 and linearly move the second moving block 341 in the second direction (X direction). The second linear driving unit 342 may be the same as or similar to the first linear driving unit 322. For convenience of explanation, a case where the second linear driving unit 342 includes a second motor 342-1 and a second ball screw 342-2 will now be described in detail.

The second guide unit 343 may be disposed between the housing 100 and the second moving block 341. The second guide unit 343 may be formed as a linear motion guide that guides a linear movement of the second moving block 341.

The second connection bracket 344 may be fixed to the second moving block 341. The support 310 may be fixed to the second connection bracket 344.

The second rotating unit 350 may connect the first linear movement unit 320 to the first rotating unit 330. The second rotating unit 350 may rotate the first rotating unit 330.

The second rotating unit 350 may include a second rotation driving unit 351, a second rotating bracket 352, and a second decelerator 353.

The second rotation driving unit 351 may be fixed to the first connection bracket 324. The second rotation driving unit 351 is formed to be the same as or similar to the first rotation driving unit 331, and thus a detailed description thereof is omitted herein.

The first rotating unit 330 may be provided on the second rotating bracket 352. For example, the first rotation driving unit 331 and the first decelerator 333 are fixed to the second rotating bracket 352.

The second decelerator 353 may be provided on the first connection bracket 324. The second decelerator 353 may connect the second rotating bracket 352 to the second rotation driving unit 351, and may reduce a torque of the second rotation driving unit 351 and deliver a reduced torque to the second rotating bracket 352.

The third linear movement unit 360 may be disposed between the support 310 and the second connection bracket 344. The third linear movement unit 360 may linearly move the support 310 in a third direction (Y direction) different from the first direction (Z direction) and the second direction (X direction). The third direction (Y direction) may be perpendicular to the first direction (Z direction) and the second direction (X direction).

The third linear movement unit 360 may include a third moving block 361, a third linear driving unit 362, and a third guide unit 363. The third moving block 361 may be fixed to the support 310. For example, the third moving block 361 is integrally formed with the support 310. The third linear driving unit 362 may be formed in various shapes and may be the same as or similar to the first and second linear driving units 322 and 342. However, for convenience of description, a case where the third linear driving unit 362 includes a third cylinder 362-1 will now be described in detail. The third guide unit 363 may connect the third moving block 361 to the second connection bracket 344. For example, the third guide unit 363 has a linear motion guide type to guide the third moving block 361 when the third moving block 361 moves.

The pressurizer 370 may be connected to the first rotating unit 330. For example, the pressurizer 370 is provided on the first attachment unit 332. The pressurizer 370 may have a cylindrical shape and thus pressurize the member 10. For example, the pressurizer 370 prevents warping of the member 10 by pressing a portion of the first surface S1 of the member 10 against another portion of the first surface S1 of the member 10 while the member 10 is being bented.

The stage driving unit 400 may be provided between the housing 100 and the stage 200. The stage driving unit 400 may include any of devices and structures that enable the stage 200 to reciprocate in the second direction (X direction). For example, the stage driving unit 400 includes a ball screw connected to the stage 200, and a motor connected to the ball screw. According to another embodiment, the stage driving unit 400 includes a linear motor connected to the housing 100 and the stage 200. According to another embodiment, the stage driving unit 400 includes a cylinder which is connected to the housing 100 and the stage 200 and has a varying length. For convenience of description, a case where the stage driving unit 400 includes a linear motor will now be described in detail.

The alignment unit 500 may be provided on the stage 200. In this case, the alignment unit 500 may change a location of the stage 200. For example, the alignment unit 500 moves the stage 200 in at least one of the second direction (X direction) and the third direction (Y direction). The alignment unit 500 may also rotate the stage 200 on a plane formed by the second direction (X direction) and the third direction (Y direction). The alignment unit 500 may be a motor, a cylinder, or the like provided around the stage 200.

The first location detecting unit 600 may be disposed on a movement path of the stage 200. For example, the first location detecting unit 600 is disposed between an initial location of the stage 200 and the bending unit 300.

The first location detecting unit 600 may sense a location of the member 10 on the stage 200. For example, the first location detecting unit 600 is a charge-coupled device (CCD), and photographs the member 10 on the stage 200 and externally transmits an image of the member 10.

The second location detecting unit 700 may be disposed near the bending unit 300 so as to be spaced apart from the bending unit 300. The second location detecting unit 700 may sense a location of the member 10 arranged on a lower surface of the bending unit 300. The second location detecting unit 700 may be formed to be the same as or similar to the first location detecting unit 600.

Regarding an operation of the above-described apparatus 1, the member 10 may be safely seated on the stage 200. The member 10 may be safely seated on the stage 200 by using an externally-provided robot arm or by using a shuttle or the like on which the member 10 is safely seated.

When the member 10 is safely seated on the stage 200, the stage driving unit 400 may linearly move the stage 200. At this time, the stage 200 may move to the second location detecting unit 700 via the first location detecting unit 600. The stage 200 may stop under the first location detecting unit 600. The first location detecting unit 600 may photograph a location of the member 10 on the stage 200.

A controller may compare the location of the member 10 photographed by the first location detecting unit 600 with a preset location and thus check the location of the member 10. For example, when the member 10 includes the display panel 20 and the flexible PCB 30 provided on the display panel 20, first alignment marks A1 are formed on the display panel 20. For example, the first alignment marks A1 are formed on the first surface S1 of the display panel 20. In this case, the first location detecting unit 600 may photograph the first alignment marks A1 and compare the photographed first alignment marks A1 with preset alignment marks, respectively. Based on a result of the comparison, the alignment unit 500 may finely adjust the location of the stage 200. For example, the alignment unit 500 changes the location of the stage 200 in at least one of the second direction (X direction) and the third direction (Y direction) or rotate the location of the stage 200 on a plane that is formed by the second direction (X direction) and the third direction (Y direction).

When this alignment is completed, the stage 200 may move toward the bending unit 300 and then may be positioned below the bending unit 300. At this time, the first attachment unit 332 may face the second surface S2 of the member 10.

The first attachment unit 332 positioned as described above may move in the first direction (Z direction) to adhere to the second surface S2 of the member 10. At this time, the first attachment unit 332 may adhere to the member 10 such that the first attachment unit 332 avoids terminals, pads, and conductive lines formed on the member 10. For example, the member 10 includes an attachment region T to which the first attachment unit 332 is attached. The attachment region T may be a region on which externally-connected terminals and pads and internally-formed conductive lines as described above are not formed.

The first attachment unit 332 may bend the member 10 along a preset bending path. For example, the first attachment unit 332 moves along the preset bending path according to operations of the first linear driving unit 322, the second linear driving unit 342, and the first rotation driving unit 331 (see FIGS. 5 and 6).

For example, the first linear driving unit 322 is operated to move the first attachment unit 332 in the first direction (Z direction) to attach the first attachment unit 332 to the second surface S2 of the flexible PCB 30. At this time, a portion of the member 10 may protrude from the stage 200, and a portion of the second surface S2 of the member 10 may be exposed to the outside.

When the second surface S2 of the flexible PCB 30 is attached to the first attachment unit 332 as described above, the first linear driving unit 322, the second linear driving unit 342, and the first rotation driving unit 331 may be operated to move the first attachment unit 332. At this time, the first attachment unit 332 may linearly move in the second direction (X direction) while ascending and descending in the first direction (Z direction). The first surface S1 of the member 10 may be bent by an operation of the first rotation driving unit 331, according to locations of the first attachment unit 332. At this time, a portion of the member 10 that is bent may be a portion of at least one of the display panel 20 and the flexible PCB 30. For example, the portion of the display panel 20 that is bent is a portion other than the display region, and is a portion on which a display unit to be described later is not formed. When the flexible PCB 30 is bent, a portion of the flexible PCB 30 that is bent is a portion having no terminals, pads, and the like formed thereon.

A bending path along which the member 10 is bent may be preset. For example, the bending path of the member 10 is set in consideration of, for example, the type of member 10, the location of the member 10, and a stress applied to the member 10 when the member 10 is bent. The bending path may be in a state of being preset in a table form in consideration of such conditions as described above.

When the first attachment unit 332 moves along the bending path, the flexible PCB 30 of the member 10 may be bent as shown in FIGS. 5-7. At this time, the second surface S2 of the flexible PCB 30 may be bent and move upwards. At this time, the second surface S2 of the display panel 20 may move together with the second surface S2 of the flexible PCB 30, and thus a portion of the first surface S1 of the display panel 20 may be bent and then may face another portion of the first surface S1 of the display panel 20. At this time, an adhesion member 40 may be disposed on the first surface S1 of the display panel 20 and may contact the portion of the first surface S1 of the display panel 20 that is bent.

The adhesion member 40 may be formed to have a different size from the member 10. For example, the adhesion member 40 is formed to have a smaller size than the member 10. For example, the adhesion member 40 is formed to have a smaller size than the display panel 20.

While such a bending is performed, the pressurizer 370 may pressurize a portion of the member 10 to prevent the member 10 from being bent. For example, the pressurizer 370 pressurizes at least one of the flexible PCB 30 and the display panel 20 to thereby prevent at least one of the flexible PCB 30 and the display panel 20 from being bent.

After bending of the member 10 is completed as described above, the second location detecting unit 700 may detect a location of the member 10. For example, the second location detecting unit 700 photographs the first alignment marks A1 on the first surface S1 of the display panel 20 and second alignment marks A2 on the second surface S2 of the flexible PCB 30.

Based on the photographed first and second alignment marks A1 and A2, the controller may determine whether an actual location of the member 10 after the member 10 is completely bent is identical with a preset location. For example, when comparing the preset location and the actual location of the member 10 according to FIG. 4, FIG. 4 illustrates a portion of the second surface S2 of the flexible PCB 30 and a portion of the first surface S1 of the display panel 20. In this case, the controller may compare a second alignment mark A2 with a preset alignment mark based on a captured image as in FIG. 4, and thus may determine how much a preset location of the flexible PCB 30 and an actual location of the flexible PCB 30 are different in the second direction (X direction) and the third direction (Y direction).

The controller may calculate a difference between the second alignment mark A2 and the preset alignment mark in the second direction (X direction). The preset alignment mark may be a location of the second alignment mark A2 when the member 10 is accurately attached to the adhesion member 40 when the member 10 is bent. According to another embodiment, the preset alignment mark is a location of the second alignment mark A2 when the flexible PCB 30 is bent and then accurately positioned at the preset location as compared with the location of the display panel 20 of the member 10. According to another embodiment, the preset alignment mark is a location of at least one of the first and second alignment marks A1 and A2 when a portion of the member 10 is accurately positioned at the preset location when the member 10 is bent. However, for convenience of explanation, a case where the preset alignment mark is a location of the second alignment mark A2 when the flexible PCB 30 is bent and then accurately positioned at the preset location as compared with the location of the display panel 20 of the member 10 will now be described in detail.

For example, the controller calculates a difference X1 between a second alignment mark A2 and a preset alignment mark on the left side of FIG. 4 in the second direction (X direction). The controller may also calculate a difference X2 between a second alignment mark A2 and a preset alignment mark on the right side of FIG. 4 in the second direction (X direction). When the values of the differences X1 and X2 are not 0, the controller may determine that a final location of the bent member 10 is different from the preset location. In this case, a difference X between the final location of the bent member 10 and the preset location in the second direction (X direction) may be calculated using Equation 1:

$$X=(X1+X2)/2 \qquad \text{[Equation 1]}$$

where X1 and X2 may have negative values when the second alignment mark A2 is apart from the preset location in one direction, and have positive values when the second alignment mark A2 is apart from the preset location in a direction opposite to the one direction. However, for convenience of explanation, a case where the differences X1 and X2 have positive values when the second alignment mark A2 is below the preset location and have negative values when the second alignment mark A2 is over the preset location, based on FIG. 4 will now be described in detail.

As described above, the controller may calculate a difference between the final location of the bent member 10 and the preset location in the third direction (Y direction), based on the image captured by the second location detecting unit 700. For example, the controller calculates a difference Y1 between the second alignment mark A2 and the preset alignment mark on the left side of FIG. 4 in the third direction (Y direction). The controller may also calculate a difference Y2 between the second alignment mark A2 and the preset alignment mark on the right side of FIG. 4 in the third direction (Y direction). In this case, a difference Y between the final location of the bent member 10 and the preset location in the third direction (Y direction) may be calculated using Equation 2:

$$Y=(Y1+Y2)/2 \qquad \text{[Equation 2]}$$

where Y1 and Y2 may have negative values when the second alignment mark A2 is apart from the preset location in one direction, and have positive values when the second alignment mark A2 is apart from the preset location in a direction opposite to the one direction. However, for convenience of explanation, a case where the differences Y1 and Y2 have negative values when the second alignment mark A2 is on the left side of the preset location and have positive values when the second alignment mark A2 is on the right side of the preset location, based on FIG. 4, will now be described in detail.

When the calculations of the differences X and Y are completed as described above, the controller may calculate a rotation angle (θ) by which the final location of the member 10 rotated from the preset location. For example, the controller calculates the rotation angle (θ), based on the first alignment mark A1 and the second alignment mark A2 photographed by the second location detecting unit 700. For example, the controller calculates an angle θ1 between a line connecting the first and second alignment marks A1 and A2 on the left side of FIG. 4 and a line (e.g., a base line) passing through the second alignment mark A2 while being parallel to the third direction (e.g., Y direction). The controller also calculates an angle θ2 between a line connecting the first and second alignment marks A1 and A2 on the right side of FIG. 4 and a line (e.g., a base line) passing through the first alignment mark A1 while being parallel to the second direction (e.g., X direction). The rotation angle (θ) may be calculated using Equation 3:

$$\theta=(\theta1+\theta2)/2 \qquad \text{[Equation 3]}$$

where θ1 and θ2 may have negative values when being measured when the line connecting the first and second alignment marks A1 and A2 rotates from the base line in one direction, and have positive values when being measured when the line connecting the first and second alignment marks A1 and A2 rotates from the preset location in a direction opposite to the one direction. For example, θ1 and θ2 have negative values when being measured when the line connecting the first and second alignment marks A1 and A2 rotates clockwise with respect to the base line, and have positive values when being measured when the line connecting the first and second alignment marks A1 and A2 rotates counterclockwise with respect to the base line.

According to another embodiment, θ1 and θ2 have positive values when being measured when the line connecting the first and second alignment marks A1 and A2 rotates clockwise with respect to the base line, and have negative values when being measured when the line connecting the first and second alignment marks A1 and A2 rotates counterclockwise with respect to the base line. For convenience of explanation, a case where the angles θ1 and θ2 have negative values when being measured when the line connecting the first and second alignment marks A1 and A2 rotates clockwise with respect to the base line and have positive values when being measured when the line connecting the first and second alignment marks A1 and A2 rotates counterclockwise with respect to the base line will now be focused and described in detail.

When the values of X, Y, and θ are calculated as described above, the second linear driving unit 342 and the third linear driving unit 362 may be operated to move the first attachment unit 332 so that the values of X and Y are offset. On the other hand, the second rotation driving unit 351 may be operated to rotate the first attachment unit 332 so that the values of X and Y correspond to the calculated value of 0. For example, when the difference X has a positive value, the second linear driving unit 342 may move the first attachment unit 332 in a −X direction. When the difference X has a negative value, the second linear driving unit 342 may move the first attachment unit 332 in a +X direction. When the difference Y has a positive value, the third linear driving unit 362 may move the first attachment unit 332 in a −Y direction. On the other hand, when the difference Y has a negative value, the third linear driving unit 362 may move the first attachment unit 332 in a +Y direction. In the case of the value of θ, the second rotation driving unit 351 may rotate the first attachment unit 332 so that the first attachment unit 332 is placed at a preset location. Operation degrees of the second rotation driving unit 351 according to the values of θ may be stored in a table form.

When comparison of the actual location of the member 10 and the preset location is completed as described above, the bending unit 300 may change the actual location of the member 10 to the preset location based on a result of the comparison. For example, based on FIG. 4, the second linear driving unit 342 moves the first attachment unit 332 in the X direction, and the third linear driving unit 362 moves the first attachment unit 332 in the Y direction. The second rotation driving unit 351 may be rotated clockwise.

When such a fine adjustment is not performed after the member 10 is bent, the member 10 is mismatched with the preset location, and thus a stress other than a preset stress may be applied to the member 10. In this case, after the member 10 is attached to the adhesion member 40 and then bending of the member 10 is completed, the member 10 may be damaged or broken. Thus, as described above, the location of a portion of the member 10 is adjusted to the preset location, and thus damage and breakdown of the member 10 due to concentration of a stress generated after bending may be minimized.

When the flexible PCB 30 is bent as described above, a force supply unit 800 may be operated to pressurize at least one of the second surface S2 of the display panel 20 and the second surface S2 of the flexible PCB 30. According to the operation of the force supply unit 800, the first attachment unit 332 may be detached from the second surface S2, and a portion of the first surface S1 of the display panel 20 may be attached to the adhesion member 40.

In this case, the force supply unit 800 may have any of various shapes. For example, the force supply unit 800 includes a cylinder. According to another embodiment, the force supply unit 800 may include a ball screw and a motor connected to the ball screw. The force supply unit 800 is not limited thereto, and the force supply unit 800 may include any of devices and structures that attach a portion of the member 10 to the adhesion member 40 by supplying a force to the member 10 by linearly moving in the first direction (Z direction).

The force supply unit 800 may be included in the bending unit 300 or may be included in a portion of the apparatus 1 other than the bending unit 300.

The bending unit 300 may return to an initial state. The completely bent member 10 may be carried out via a special robot arm or the like.

Thus, the apparatus 1 may minimize breakdown and damage of the member 10 by preventing an excessive stress from being applied to the member 10 when the member 10 is bent. Moreover, the apparatus 1 may minimize the time required to bend the member 10 by providing an optimal bending path, and may improve the productivity.

Figure 8:
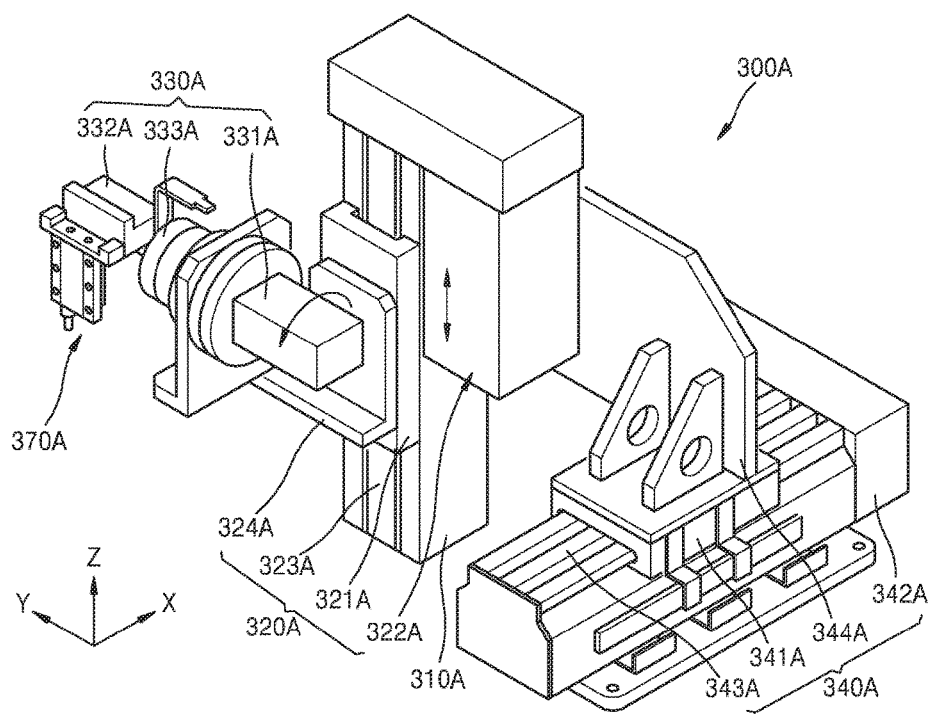
FIG. 8 is a perspective view of another embodiment of the bending unit of FIG. 1.

FIG. 8 is a perspective view of a bending unit 300A, which is another embodiment of the bending unit 300 of FIG. 1.

Referring to FIG. 8, the bending unit 300A includes a support 310A, a first linear movement unit 320A, a first rotating unit 330A, a second linear movement unit 340A, a pressurizer 370A and a force supply unit (not shown).

The first linear movement unit 320A may include a first moving block 321A, a first linear driving unit 322A, a first guide unit 323A, and a first connection bracket 324A. The first rotating unit 330A may include a first rotation driving unit 331A, a first attachment unit 332A, and a first decelerator 333A. The second linear movement unit 340A may include a second moving block 341A, a second linear driving unit 342A, a second guide unit 343A, and a second connection bracket 344A.

The support 310A, the first linear movement unit 320A, the first rotating unit 330A, the second linear movement unit 340A, and the pressurizer 370A are the same as or similar to their counterparts described above, and thus a detailed description thereof will be omitted here.

Regarding an operation of the bending unit 300A, first, a location of a member (not shown) on a stage (not shown) may be checked by a first location detecting unit (not shown), and then the stage may be finely adjusted to adjust the location of the member. A method of adjusting the location of the member is the same as or similar to that described above, and thus a detailed description thereof is omitted herein.

When the member is disposed below a lower surface of the bending unit 300A, the support 310A, the first linear movement unit 320A, the first rotating unit 330A, the second linear movement unit 340A, and the pressurizer 370A may be operated to bend the member.

For example, the second linear driving unit 342A is operated to dispose the first attachment unit 332A below a lower surface of a second surface (not shown) of the member. The second linear driving unit 342A may also be driven to attach the first attachment unit 332A to the second surface. The first attachment unit 332A may contact the second surface and be attached thereto.

When such a process is completed, the second linear driving unit 342A, the first linear driving unit 322A, and the first rotation driving unit 331A may be operated to bend the member. At this time, the member may move in the first direction (Z direction) and the second direction (X direction) and simultaneously rotate on a plane formed by the first direction (Z direction) and the second direction (X direction). For example, the member is bent along a preset bending path. The preset bending path may be a path along which the first attachment unit 332A moves.

When the member is bent along the bending path as described above, a portion of a first surface (not shown) of the member may be positioned on another portion of the first surface, as shown in FIGS. 6 and 7.

While the member is being bent as described above, the pressurizer 370A may pressurize the second surface, and bending or bulging of the member may be prevented according to an operation of the pressurizer 370A.

Thereafter, the force supply unit (not shown) may pressurize the second surface. At this time, a portion of the first surface of the member may be moved to another portion of the first surface of the member and may contact and be attached to an adhesion member (not shown). At this time, according to an operation of the bending unit 300A, the first attachment unit 332A may be detached from the second surface of the member.

When such a process is completed, the member may be completely bent. Thereafter, the completely bent member on the stage may be carried out via an external robot arm or the like.

Thus, an apparatus (not shown) for manufacturing a display device may minimize the time required to bend the member by providing an optimal bending path, and may improve the productivity.

Figure 9:
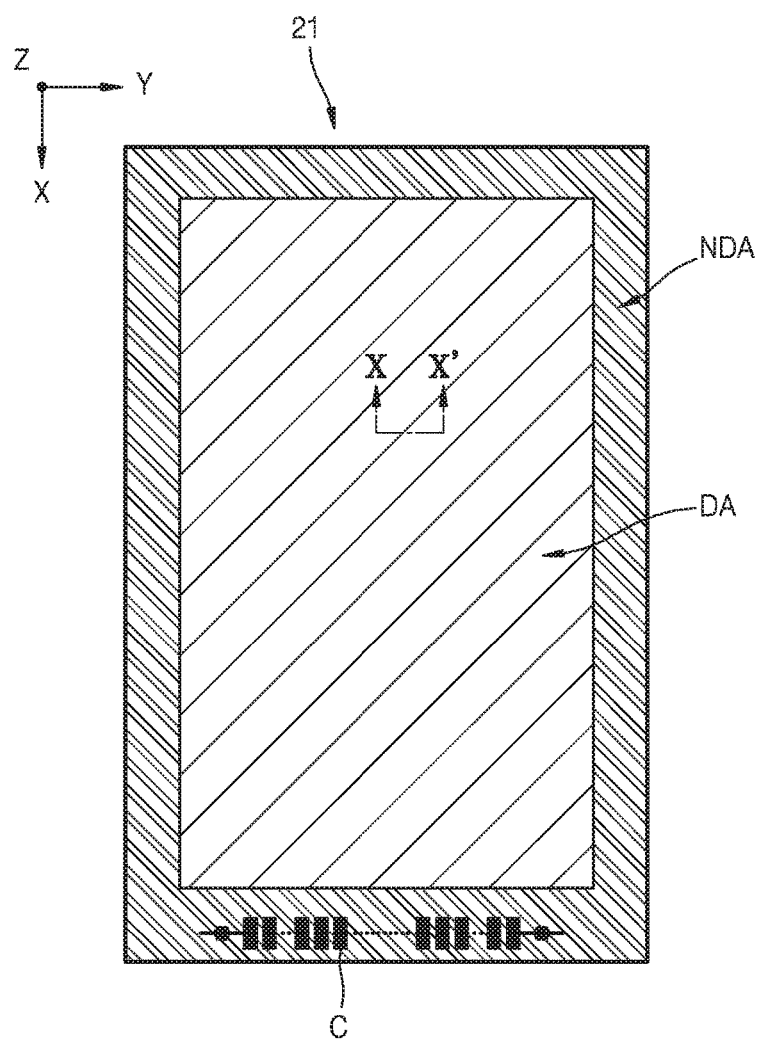
FIG. 9 is a plan view of a display panel included in the apparatus 1 of FIG. 1.
Figure 10:
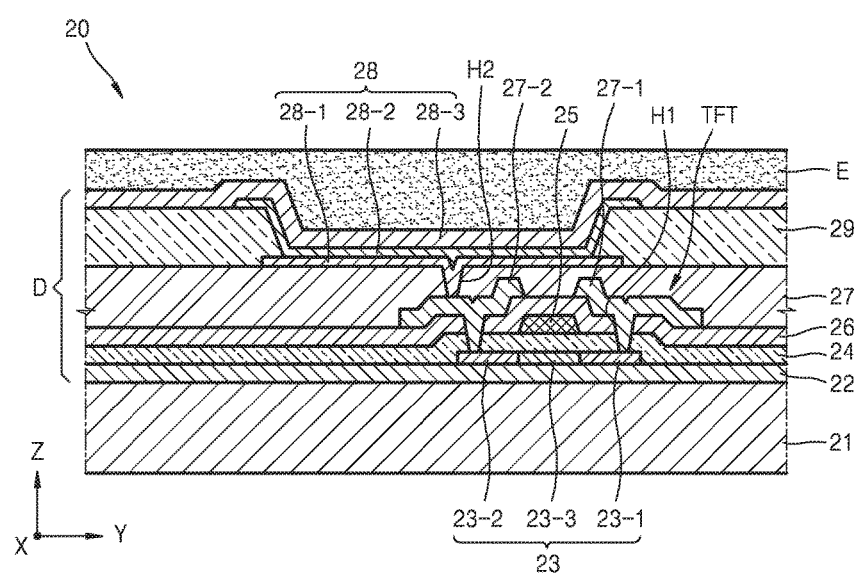
FIG. 10 is a cross-sectional view taken along line X-X' of FIG. 9.

FIG. 9 is a plan view of the display panel 20 of the apparatus 1 of FIG. 1. FIG. 10 is a cross-sectional view taken along line X-X' of FIG. 9.

Referring to FIGS. 9 and 10, the display panel 20 includes a display region DA on a substrate 21. A display unit D may be disposed in the display region DA, and power wiring (not shown) or the like may be disposed in a non-display region NDA. A pad unit C may be disposed in the non-display region NDA. The display region DA of the display panel 20 will now be described in more detail.

The display panel 20 may include the substrate 21, the display unit D, and a thin-film encapsulation layer E. Various layers may be stacked on the substrate 21. The substrate 21 may be formed of a plastic material, or may use a metal material, such as, steel use stainless (SUS) or titanium (Ti). Alternatively, the substrate 21 may be formed of polyimide (PI).

The substrate 21 may include a plurality of substrate. For example, the substrate 21 may comprise a first substrate (not shown) and a second substrate. The first substrate and the second substrate may be stack on each other. The first substrate may be formed of a plastic material, or may use a metal material, such as, steel use stainless (SUS) or titanium (Ti). Alternatively, the second substrate may be formed of polyimide (PI). The second substrate may be formed of polyethyelenetereptlalate (PET) or polyimide (PI). And an opening may be formed in the second substrate. The opening of the second substrate may locate at a bending area of the first substrate.

For convenience of description, a case where the substrate 21 only includes the first substrate and the substrate 21 is formed of PI will now be described in detail.

The display unit D may be formed on the substrate 21. The display unit D may include a thin film transistor TFT, a passivation layer 27 covering the thin film transistor TFT, and an organic light-emitting diode (OLED) 28 formed on the passivation layer 27.

A buffer layer 22 formed of an organic compound and/or an inorganic compound is further formed on an upper surface of the substrate 21. The buffer layer 22 may be formed of silicon oxide ($SiO_x$) ($x \geq 1$) or silicon nitride ($SiN_x$) ($x \geq 1$).

An active layer 23 arranged in a predetermined pattern is formed on the buffer layer 22 and is then buried by a gate insulating layer 24. The active layer 23 includes a source region 23-1 and a drain region 23-2 and further includes a channel region 23-3 therebetween.

The active layer 23 may be formed of various materials. For example, the active layer 23 is formed of an inorganic semiconductor material such as amorphous silicon or crystalline silicon. As another example, the active layer 23 is formed of an oxide semiconductor. As another example, the active layer 23 is formed of an organic semiconductor material. However, for convenience of description, a case where the active layer 23 is formed of amorphous silicon will now be described in detail.

The active layer 23 may be formed by forming an amorphous silicon layer on the buffer layer 22, crystallizing the amorphous silicon layer to form a polycrystalline silicon layer, and patterning the polycrystalline silicon layer. The source region 23-1 and the drain region 23-2 of the active layer 23 are doped with impurities according to a TFT type, such as a driving TFT, a switching TFT, or the like. The channel region 23-3 may be formed between the source region 23-1 and the drain region 23-2.

A gate electrode 25 facing the active layer 23, and an interlayer insulating layer 26 which buries the gate electrode 25 are formed on an upper surface of the gate insulating layer 24.

Contact holes H1 are formed in the interlayer insulating layer 26 and the gate insulating layer 24, and then a source electrode 27-1 and a drain electrode 27-2 are formed on the interlayer insulating layer 26 such that the source electrode 27-1 and the drain electrode 27-2 contact the source region 23-1 and the drain region 23-2, respectively.

The passivation layer 27 is formed on the thin film transistor TFT formed as described above, and a pixel electrode 28-1 of the OLED 28 is formed on the passivation layer 27. The pixel electrode 28-1 contacts the drain electrode 27-2 of the thin-film transistor TFT through a via hole H2 formed in the passivation layer 27. The passivation layer 27 may be formed of an inorganic material and/or an organic material and as a single layer or multiple layers. The passivation layer 27 may be formed as a planarization layer such that an upper surface thereof is flat regardless of the unevenness of a lower layer under the passivation layer 27. Alternatively, the passivation layer 27 may be formed to be uneven according to the unevenness of the lower layer. The passivation layer 27 may be formed of a transparent insulator so that a resonance effect is achieved.

After forming the pixel electrode 28-1 on the passivation layer 27, a pixel-defining layer 29 is formed of an organic material and/or an inorganic material such that the pixel-defining layer 29 covers the pixel electrode 28-1 and the passivation layer 27. The pixel-defining layer 29 has an aperture via which the pixel electrode 28-1 is exposed.

An intermediate layer 28-2 and an opposite electrode 28-3 are formed on at least the pixel electrode 28-1.

The pixel electrode 28-1 functions as an anode, and the opposite electrode 28-3 functions as a cathode. Alternatively, the pixel electrode 28-1 may function as a cathode, and the opposite electrode 28-3 may function as an anode.

The pixel electrode 28-1 and the opposite electrode 28-3 are insulated from each other by the intermediate layer 28-2, and respectively apply voltages of opposite polarities to the intermediate layer 28-2 to induce light emission in an organic emission layer.

The intermediate layer 28-2 may include an organic emission layer. For example, the intermediate layer 28-2 includes an organic emission layer. However, the intermediate layer 28-2 may further include at least one of a hole injection layer (HIL), a hole transport layer (HTL), an electron transport layer (ETL), and an electron injection layer (EIL). The present embodiment is not limited thereto, and the intermediate layer 28-2 may further include various other functional layers (not shown) in addition to an organic emission layer.

One unit pixel includes a plurality of sub-pixels, and the plurality of sub-pixels may emit light of various colors. For example, the unit pixel may include a plurality of sub-pixels which respectively emit red light, green light, and blue light, or a plurality of sub-pixels which respectively emit red light, green light, blue light, and white light.

The thin-film encapsulation layer E may include a plurality of inorganic layers or include an inorganic layer and an organic layer.

The organic layer of the thin-film encapsulation layer E is formed of a polymer and may be a single layer or a layer stack formed of polyethylene terephthalate (PET), PI, polycarbonate (PC), epoxy, polyethylene, or polyacrylate. The organic layer may be formed of polyacrylate. For example, the organic layer is the result of polymerizing a monomer composition including a diacrylate-based monomer and a triacrylate-based monomer. The monomer composition may further include monoacrylate-based monomer. The monomer composition may further include a well-known photoinitiator such as trimethyl benzoyl diphenyl phosphine oxide (TPO), but embodiments are not limited thereto.

The inorganic layer of the thin-film encapsulation layer E may be a single layer or a layer stack including metal oxide or metal nitride. For example, the inorganic layer may include $SiN_x$, $Al_2O_3$, $SiO_2$, or $TiO_2$.

An uppermost layer exposed to the outside in the thin-film encapsulation layer E may be formed of an inorganic layer to prevent infiltration of moisture to the OLED 28.

The thin-film encapsulation layer E may include at least one sandwich structure in which at least one organic layer is interposed between at least two inorganic layers. Alternatively, the thin-film encapsulation layer E may include at least one sandwich structure in which at least one inorganic layer is interposed between at least two organic layers. Alternatively, the thin-film encapsulation layer E may include a sandwich structure in which at least one organic layer is interposed between at least two inorganic layers and a sandwich structure in which at least one inorganic layer is interposed between at least two organic layers.

The thin-film encapsulation layer E may include a first inorganic layer, a first organic layer, and a second inorganic layer sequentially formed starting from an upper portion of the OLED 28.

Alternatively, the thin-film encapsulation layer E may include a first inorganic layer, a first organic layer, a second inorganic layer, a second organic layer, and a third inorganic layer sequentially formed starting from the upper portion of the OLED 28.

Alternatively, the thin-film encapsulation layer E may include a first inorganic layer, a first organic layer, a second inorganic layer, a second organic layer, a third inorganic layer, a third organic layer, and a fourth inorganic layer sequentially formed starting from the upper portion of the OLED 28.

A halogenated metal layer including lithium fluoride (LiF) may be further included between the OLED 28 and the first inorganic layer. The halogenated metal layer may prevent the OLED 28 from being damaged when the first inorganic layer is formed by sputtering.

The first organic layer may have a smaller area than the second inorganic layer, and the second organic layer may also have a smaller area than the third inorganic layer.

Embodiments may reduce breakdown and damage of a member by minimizing a stress applied to the member after the member is bent.

Embodiments are able to rapidly manufacture a product by providing an optimal path for bending a member.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
   placing at least a portion of a component of the display device on a stage;
   arranging the component of the display device on a surface of a bending unit; and
   applying a rotational force to the component of the display device to bend the component of the display device along a bending path of the component of the display device.

2. The method of claim 1, further comprising comparing an actual location of the component of the display device with a preset location for the component of the display device.

3. The method of claim 2, further comprising positioning the component of the display device based on the comparing of the actual location of the component of the display device with the preset location for the component of the display device.

4. The method of claim 1, further comprising applying pressure to the component of the display device so as to attach a portion of the component of the display device to an adhesion member.

5. The method of claim 4, wherein the adhesion member is smaller than the component of the display device.

6. The method of claim 1, wherein the component of the display device is flexible.

7. The method of claim 1, further comprising sensing a location of the component of the display device on the stage.

8. The method of claim 7, further comprising varying a location of the stage based on the location of the component of the display device.

9. The method of claim 1, wherein the component of the display device comprises at least one of a display panel and a flexible printed circuit board (PCB).

10. The method of claim 9, wherein at least one of the display panel and the flexible PCB is bent when the component of the display device is bent.

11. The method of claim 1, wherein the component of the display device comprises an attachment region to which the bending unit is attached.

12. The method of claim 1, wherein the component of the display device comprises a first surface and a second surface different from the first surface, and wherein the bending unit is configured to attach a portion of the second surface thereto and bend the component of the display device so as to attach a portion of the first surface to another portion of the first surface.

13. The method of claim 1, wherein applying force to a portion of the component of the display device when the component of the display device is bent so as to prevent warping of the component of the display device.

14. The method of claim 1, wherein the bending unit comprises a rotation driving unit.

15. The method of claim 14, wherein the bending unit further comprises an attachment unit connected to the rotation driving unit, wherein the attachment unit is attached to the component of the display device, and wherein the component is rotated by rotation of both of the rotation driving unit and the attachment unit.

16. The method of claim 15, wherein the component is rotated in a counter clockwise direction.

17. The method of claim 1, further comprising:
applying force perpendicular to a surface of the component of the display device, facing the stage, after the component is bent.

18. A method of manufacturing a display device, the method comprising:
placing at least a portion of a component of the display device on a stage;
arranging the component of the display device on a surface of a bending unit;
attaching the bending unit to the component of the display device; and
bending the component of the display device along a bending path of the component of the display device by rotating the bending unit.

* * * * *